United States Patent [19]
Mizuno

[11] Patent Number: 6,085,690
[45] Date of Patent: Jul. 11, 2000

[54] CHEMICAL VAPOR DEPOSITION APPARATUS

[75] Inventor: Shigeru Mizuno, Kanagawa-ken, Japan

[73] Assignee: Anelva Corporation, Tokyo, Japan

[21] Appl. No.: 09/394,900

[22] Filed: Sep. 13, 1999

Related U.S. Application Data

[62] Division of application No. 08/932,424, Sep. 17, 1997.

[30] Foreign Application Priority Data

Nov. 15, 1996 [JP] Japan .................................. 8-321144

[51] Int. Cl.[7] .................................................. C23C 16/00
[52] U.S. Cl. ........................ 118/723 E; 118/725; 118/715
[58] Field of Search .................................... 118/715, 723 E, 118/723 ER, 716, 737, 729, 725; 156/345; 204/298, 298.01, 298.07, 298.09

[56] References Cited

U.S. PATENT DOCUMENTS

| | | | |
|---|---|---|---|
| 4,981,722 | 1/1991 | Moller et al. | 118/715 X |
| 4,989,541 | 2/1991 | Mikoshiba et al. | 118/715 X |
| 5,000,113 | 3/1991 | Wang et al. | 118/715 |
| 5,338,363 | 8/1994 | Kawata et al. | 118/715 |

FOREIGN PATENT DOCUMENTS

| | | |
|---|---|---|
| 1-129974 | 5/1989 | Japan . |
| 3-268320 | 11/1991 | Japan . |

*Primary Examiner*—Shrive Beck
*Assistant Examiner*—Parviz Hassanzadeh
*Attorney, Agent, or Firm*—Burns, Doane, Swecker & Mathis, LLP

[57] ABSTRACT

A deposition apparatus has a reactor 11 which is furnished with a reaction gas delivery part 13 and a substrate holder 12 in which reaction gas is delivered from the reaction gas delivery part to a substrate 23 on the substrate holder, and a thin film is deposited on the substrate by means of a chemical reaction which results from supplying HF power to the reaction gas delivery part. Plasma is generated and excites the reaction gas. The gas delivery parts 27, 29, 30, 31 produce a flow of purge gas in the dead space surrounding the reaction gas deliver part. Reaction gas which is liable to be retained in the dead space is driven out by the flow of this gas, and circulation and retention of reaction gas are prevented.

8 Claims, 4 Drawing Sheets

CHEMICAL VAPOR DEPOSITION APPARATUS

This application is a divisional of application Ser. No. 08/932,424, filed Sep. 17, 1997.

BACKGROUND

1. Field of the Invention

The invention concerns film deposition apparatus and, more precisely, it concerns chemical vapor deposition (CVD) apparatus with which thin films are deposited on a substrate by means of a vapor-phase reaction invoked by plasma or heat.

2. Description of Related Art

Progress has been made with the integration and miniaturization of elements in the field of semiconductor manufacturing apparatus in recent years. The miniaturization of elements has required new techniques in the manufacturing process. For example, it has been necessary to achieve the full-filling with film of fine holes such as via holes and through holes, to reduce steps within an element and to prevent wiring breakdown due to electro-migration or heating caused by high current densities.

Sputtering cannot fulfill these requirements at the present time. With the miniaturization of holes in particular, sputtering has poor step coverage properties for fine holes. Attention has focused on plasma enhanced CVD and thermal CVD in recent years as replacements for sputtering.

Plasma is used for the chemical reaction in plasma enhanced CVD, and heat is used in thermal CVD. These types of CVD can uniformly full-fill with film right through to the base of fine holes which have a large aspect ratio. The Ti films or TiN films obtained with TiCl4 as the source gas which are used as barrier films to prevent diffusion are examples of deposition using plasma enhanced CVD. The blanket tungsten (B-W) films used for wiring purposes are an example of deposition using thermal CVD.

An example of conventional plasma enhanced chemical vapor deposition (PECVD) apparatus for Ti film or TiN film deposition is described below with reference to FIG. 4. The air-tight reactor 111 is furnished with the substrate holder 112 in the center of the lower part and with the disk-like reaction gas delivery part 113 in the upper part. The substrate holder 112 and the reaction gas delivery part 113 face one another and are roughly parallel to one another. The reaction gas delivery part 113 has gas discharge holes formed in its lower surface. The gas discharge holes are connected to the reaction gas supply mechanism 114 which is located outside the reactor 111. The reaction gas delivery part 113 is fixed via the ring-shaped insulator 116 to the upper wall 115 of the reactor 111. The gas delivery part 113 and the reactor 111 are electrically insulated by the ring-shaped insulator 116. The reactor 111 is grounded and maintained at the ground potential. On the other hand, the reaction gas delivery part 113 is connected to the high frequency (HF) source 118 via the matching circuit 117 and supplied with high frequency (HF) power.

A plurality of exhaust ports 119 are formed in the bottom wall of the reactor 111. The exhaust ports 119 are connected to the pumping mechanism 120. The interior of the reactor 111 is maintained at a prescribed pressure by reducing the pressure by means of the pumping mechanism 120.

The substrate holder 112 is fixed to the bottom wall of the reactor 111. The substrate holder 112 is grounded. The electrostatic chuck (ESC) plate 121 is established on the upper surface of the substrate holder 112. The ESC plate 121 is connected to the electrostatic chuck (ESC) control source 122. The substrate 123 which has been located on the substrate holder 112 is clamped by means of the ESC plate 121. The heater 124 is arranged within the substrate holder 112, and the thermocouple 125 which has a temperature detecting function is also provided. The detection signal from the thermocouple 125 is input to the heating control mechanism 126, and the control signal put out from the heating control mechanism 126 is applied to the heater 124.

The substrate 123 which has been transferred into the reactor 111 is arranged on the substrate holder 112. The substrate holder 112 is heated and maintained at a fixed temperature by means of the thermocouple 125, the heating control mechanism 126 and the heater 124. The substrate 123 is held by means of the ESC plate 121.

In the case of Ti film deposition H2 is introduced from the reaction gas delivery part 113 which faces the substrate 123, and $H_2$ and $N_2$ are introduced in the case of TiN film deposition. The interior of the reactor 111 is exhausted via the exhaust ports 119 by means of the pumping mechanism 120. In this way the interior of the reactor 111 is maintained at the prescribed pressure. The plurality of exhaust ports 119 are established with a symmetrical positional arrangement so that the flow of gas within the reactor 111 is symmetrical with respect to the center axis of the reactor 111. Moreover, plasma is generated between the reaction gas delivery part 113 and the substrate 123 when HF power is supplied from the HF source 118 to the reaction gas delivery part 113. A frequency from the HF band to the VHF band of from 10 to 100 MHZ is used.

$TiCl_4$ is introduced from the reaction gas delivery part 113 when the plasma has become stable. As a result, a Ti film or a TiN film is deposited on the heated substrate 123. The unreacted reaction gas and the by-product gas which is produced during film deposition is exhausted via the exhaust ports 119 by means of the pumping mechanism 120.

Reaction gas flow rates of from 2 to 10 sccm $TiCl_4$, from 300 to 1000 sccm $H_2$, from 0.2 to 4 sccm $SiH_4$, and from 10 to 100 sccm N2 (for TiN films only), a substrate holder 112 temperature of from 400 to 700° C., a HF power supply from the reaction gas delivery part 113 of from 50 to 3000 W and a frequency of from 10 to 100 MHZ are typical conditions for Ti or TiN film deposition.

A dead space 127 is formed around the reaction gas delivery part 113 in the vicinity of the upper wall of the reactor 111 in conventional PECVD apparatus, as shown in FIG. 4. The dead space 127 is inevitably produced within the reactor 111 as a result of the design conditions of the apparatus. For example, if a cylindrical reaction gas delivery part is arranged in a rectangular reactor, the space in the corners of the reactor will become a dead spaces 127. If the upper wall and the side wall of the reactor are joined with a hinge so that it can be opened and closed by rotating on the upper wall, the reaction gas delivery part which is fitted to the inside of the upper wall must be smaller than the upper wall. As a result, a dead space 127 is formed around the reaction gas delivery part. The conventional PECVD apparatus shown in FIG. 4 has the distance between the substrate holder 112 and the reaction gas delivery part 113 shortened in order to raise the utilization efficiency of the reaction gas, and the reaction gas delivery part 113 is separated from the wall of the reactor 111 in order to prevent diffusion of the plasma into the space between the wall of the reactor 111 and the reaction gas delivery part 113 which is the upper electrode. These design conditions inevitably result in the formation of the dead space 127.

The dead space 127 is located above the reaction gas flow-way in the conventional PECVD apparatus shown in FIG. 4. The dead space 127 is outside the flow-way of the reaction gas which reaches the exhaust ports 119 from the gas reaction gas delivery part 113. The reaction gas is heated by the hot substrate 123 and so convection of the heated reaction gas around the substrate 123 is liable to occur. The convection around the substrate 123 causes a circulation 128 of reaction gas to occur within the dead space 127 as shown in FIG. 5. As a result, the reaction gas remains in the dead space 127. This behavior of the flow of reaction gas is based on the results obtained from a simulation involving numerical calculations. Such a flow of reaction gas results in the build-up of undesired films on the reactor walls in the vicinity of the dead space 127. This becomes a source of dust particle contamination and has a bad effect on the manufacturing yield in semiconductor production. Here, in this specification, the term "dead space" is defined as a space in which reaction gas is retained.

OBJECTS AND SUMMARY

A purpose of the present invention is to provide CVD apparatus in which the retention of reaction gas in a dead space does not occur.

Another object of the present invention is to provide a CVD apparatus in which a purge gas flows through the dead space surrounding the reaction gas delivery part in the PECVD apparatus so no reaction gas is retained in the dead space.

It is another object to minimize the deposition of films produced by the gas phase reaction on the wall surface of a CVD apparatus so as to reduce the extent of dust particle generation.

It is yet another object to improve the manufacturing yield by the reduction of dust particle generation, and to improve productivity by improvement of the deposition rate as a secondary effect.

A CVD apparatus of the present invention has a gas delivery part which introduces a purge gas into the dead space and an exhausting part which exhausts the purge gas which has flowed into the dead space. Such a flow of purge gas sweeps away the reaction gas which has entered the dead space. As a result, there is minimal, if any, circulation of reaction gas in the dead space and the retention of reaction gas is inhibited.

A CVD apparatus of the present invention includes a gas delivery part that has a plurality of equally spaced gas delivery holes formed symmetrically with respect to a center axis of the reactor in an upper wall of the reactor. These gas delivery holes are connected to a reservoir which is formed on the inside surface of the upper wall. The reservoir is covered with a porous plate. The purge gas, which is supplied from a gas supply mechanism, passes through each gas delivery hole and is stored temporarily in the reservoir, and is then discharged from the many fine holes in the porous plate. This ensures that the purge gas flows uniformly into the whole of the dead space of the reactor.

A CVD apparatus of the present invention includes an exhausting part that has a plurality of exhaust ports which are formed at positions which are symmetrical with respect to a center axis of the reactor in a bottom wall of the reactor. The exhaust ports which are arranged in this way exhaust the purge gas, which has been introduced uniformly by the gas delivery part, uniformly across the whole of the dead space. The purge gas is introduced uniformly and exhausted uniformly and a smooth flow of purge gas is established in the dead space. A so-called uniform down-flow of purge gas is produced in the dead space. This uniform down-flow of purge gas prevents the retention of reaction gas in the dead space. Moreover, the uniform down-flow in the dead space does not disrupt the flow of reaction gas which contributes to the deposition of the film.

DETAILED DESCRIPTION OF THE PREFERRED EMBODIMENTS

Preferred embodiments of the invention are described below with reference to the attached drawings.

Figure 1:
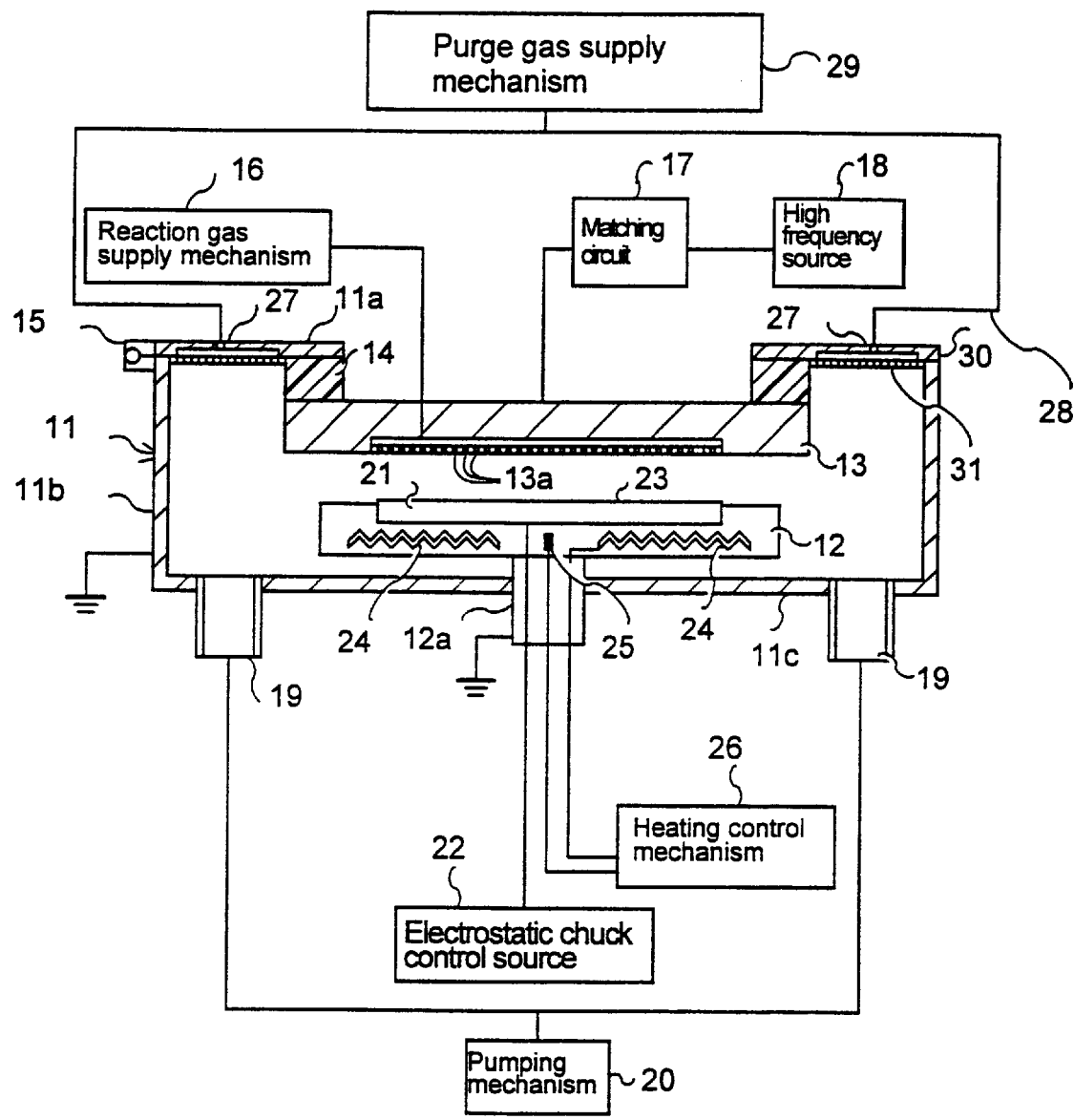
FIG. 1 is a vertical cross-sectional view which shows a typical example of an embodiment of PECVD apparatus incorporating this invention.

FIG. 1 shows the internal construction of plasma enhanced CVD (PECVD) apparatus for the deposition of Ti films or TiN films in accordance with the invention. This PECVD apparatus has an air-tight cylindrical reactor 11. The reactor 11 is furnished internally with a substrate holder 12 in the center of the lower part and with a disk-shaped reaction gas delivery part 13 in the center of the upper part. The substrate holder 12 and the reaction gas delivery part 13 face one another in a roughly parallel state. The reaction gas delivery part 13 is fixed to the upper wall 11a of the reactor 11 via a ring-like insulator 14. The upper wall 11a is fitted to open with a hinge part 15 on the circumferential wall 11b of the reactor 11. Hence, the upper wall 11a opens and closes freely on the reactor 11.

The reaction gas delivery part 13 has a plurality of gas discharge holes 13a formed in its lower surface. The gas discharge holes 13a are connected to a reaction gas supply mechanism 16 which is established externally and the reaction gas which is delivered from the reaction gas supply mechanism 16 to the reaction gas delivery part 13 passes through the gas discharge holes 13a and is delivered into the space above the substrate holder 12 within the reactor 11.

The reaction gas delivery part 13 and the reactor 11 are electrically insulated from one another by the ring-like insulator 14. The reactor 11 is grounded and maintained at the ground potential. The reaction gas delivery part 13 is connected to the HF source 18 via the matching circuit 17 and supplied with HF power. A frequency from the HF band to the VHF band of from 10 to 100 MHZ is used. The reaction gas between the reaction gas delivery part 13 and the substrate holder 12 is excited and plasma is generated by supplying the HF power to the reaction gas delivery part.

A plurality of exhaust ports 19 are formed in the bottom wall 11c of the reactor 11. The exhaust ports 19 are connected to the pumping mechanism 20. The plurality of exhaust ports 19 are arranged symmetrically with respect to the center axis of the reactor 11 around the edge of the bottom wall 11c of the reactor 11. When a pumping action is established in the space inside the reactor 11, all of the gas, including the purge gas and the reaction gas introduced into the reactor 11, flows symmetrically with respect to the center axis of the reactor 11 as a result of the arrangement of these exhaust ports 19. The pressure within the reactor 11 is reduced and maintained at the prescribed pressure by means of the pumping mechanism 20.

The substrate holder 12 is fixed with the support 12a to the bottom wall 11c of the reactor 11. The substrate holder 12 is also grounded. The ESC plate 21 is established on the upper surface of the substrate holder 12. The ESC plate 21 is connected to the ESC control source 22. The substrate 23 which is located on the substrate holder 12 is held with the ESC plate 21. The heater 24 is arranged within the substrate holder 12 which is also provided with the thermocouple 25 which has a temperature detecting function. The detection signal from the thermocouple 25 is input to the heating control mechanism 26 and the control signal put out from the heating control mechanism 26 is applied to the heater 24.

The substrate 23 which has been transferred into the reactor 11 is arranged on the substrate holder 12. The substrate holder 12 is heated to, and maintained at, a fixed temperature by means of the thermocouple 25, the heating control mechanism 26 and the heater 24. The substrate 23 is held by means of the ESC plate 21.

Figure 2:
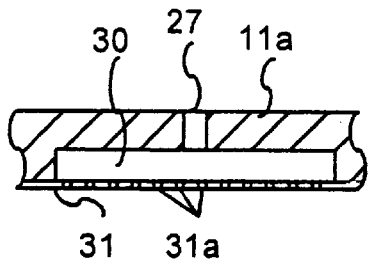
FIG. 2 is a cross-sectional view which shows an enlargement of the porous plate and reservoir parts of a PECVD apparatus of the present invention.

A plurality of holes 27 are formed with roughly equal spacing symmetrically with respect to the center axis of the reactor 11 around the peripheral part in the aforementioned upper wall 11a. Each of the holes 27 is connected to the external purge gas supply mechanism 29 via a supply-way 28. A ring-shaped reservoir 30 is formed on the lower surface of the upper wall 11a, corresponding to each of the holes 27, around the peripheral part, as shown in FIG. 1 and FIG. 2, on the inside of the upper wall 11a. Moreover, a ring-like porous plate 31 is fitted to the lower side so as to cover the reservoir 30. The porus plate 31 has a plurality of fine holes 31a. The purge gas supplied from the purge gas supply mechanism 29 is delivered to the holes 27 through the supply-way 28. The purge gas temporarily fills the reservoir 30 through the holes 27 and then passes through the fines holes 31a of the porous plate 31 and is blown out into the reactor 11.

In the case of this embodiment, four holes 27 are formed with equal spacing symmetrically with respect to the center axis of the reactor 11 in the upper wall 11a. The porous plate 31 is of thickness from 1 to 5 mm, and the fine holes 31a are of diameter from 0.1 to 1 mm. The fine holes 31a with the same diameter are formed uniformly in the porous plate 31.

The substrate 23 which has been transferred into the reactor 11 is held on the substrate holder 12 which has been set at a fixed temperature. In the case of Ti film deposition, $H_2$ is delivered from the reaction gas delivery part 13 which faces the substrate 23, and $H_2$ and $N_2$ are delivered in the case of TiN film deposition. The interior of the reactor 11 is exhausted by means of the pumping mechanism 20 through the exhaust ports 19. In this way, the pressure inside the reactor 11 is reduced and maintained at the prescribed pressure. The film deposition conditions for a normal Ti film or TiN film are the same as the conditions described in connection with the conventional technology. Moreover, the flow rate of the argon gas which is the purge gas delivered from the purge gas supply mechanism 29 into the reactor through the holes 27 is from 50 to 100 sccm.

Figure 3:
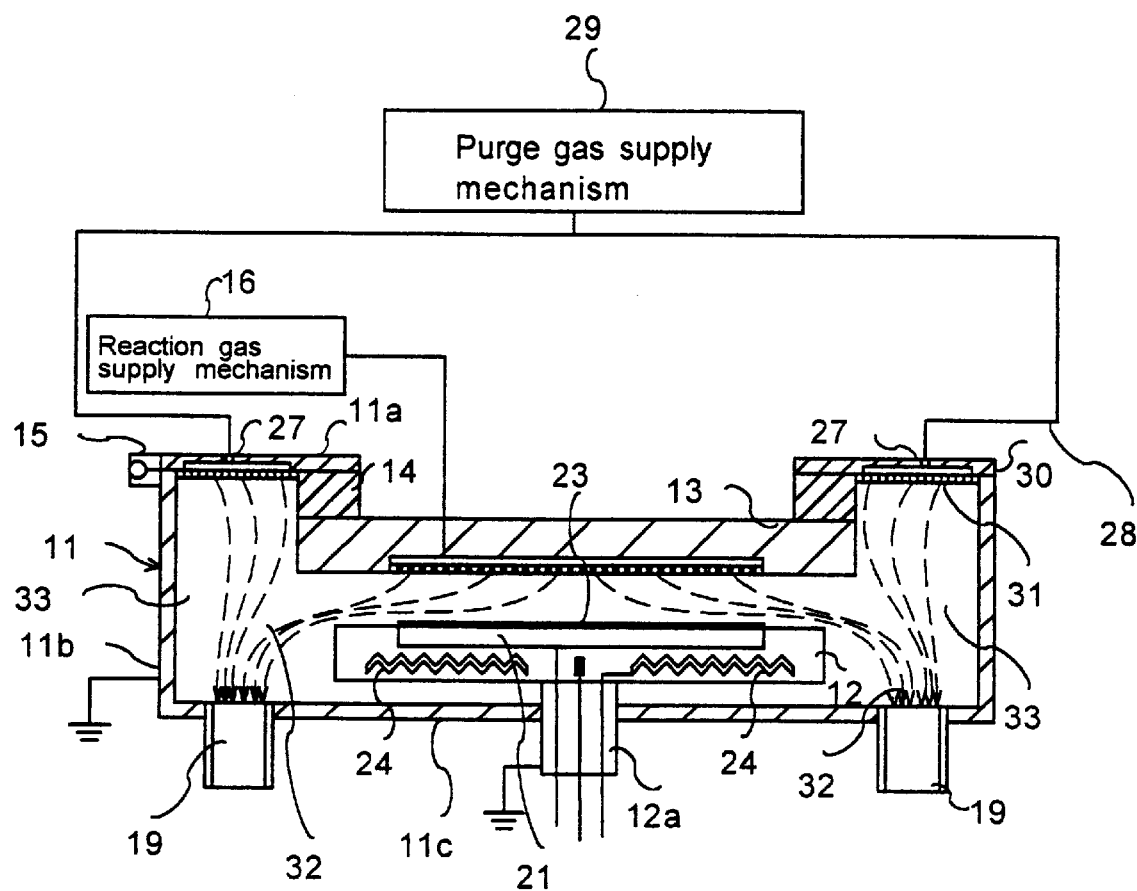
FIG. 3 is a drawing which shows the flow lines of the reaction gas and purge gas flows of a PECVD of the present invention.
Figure 4:
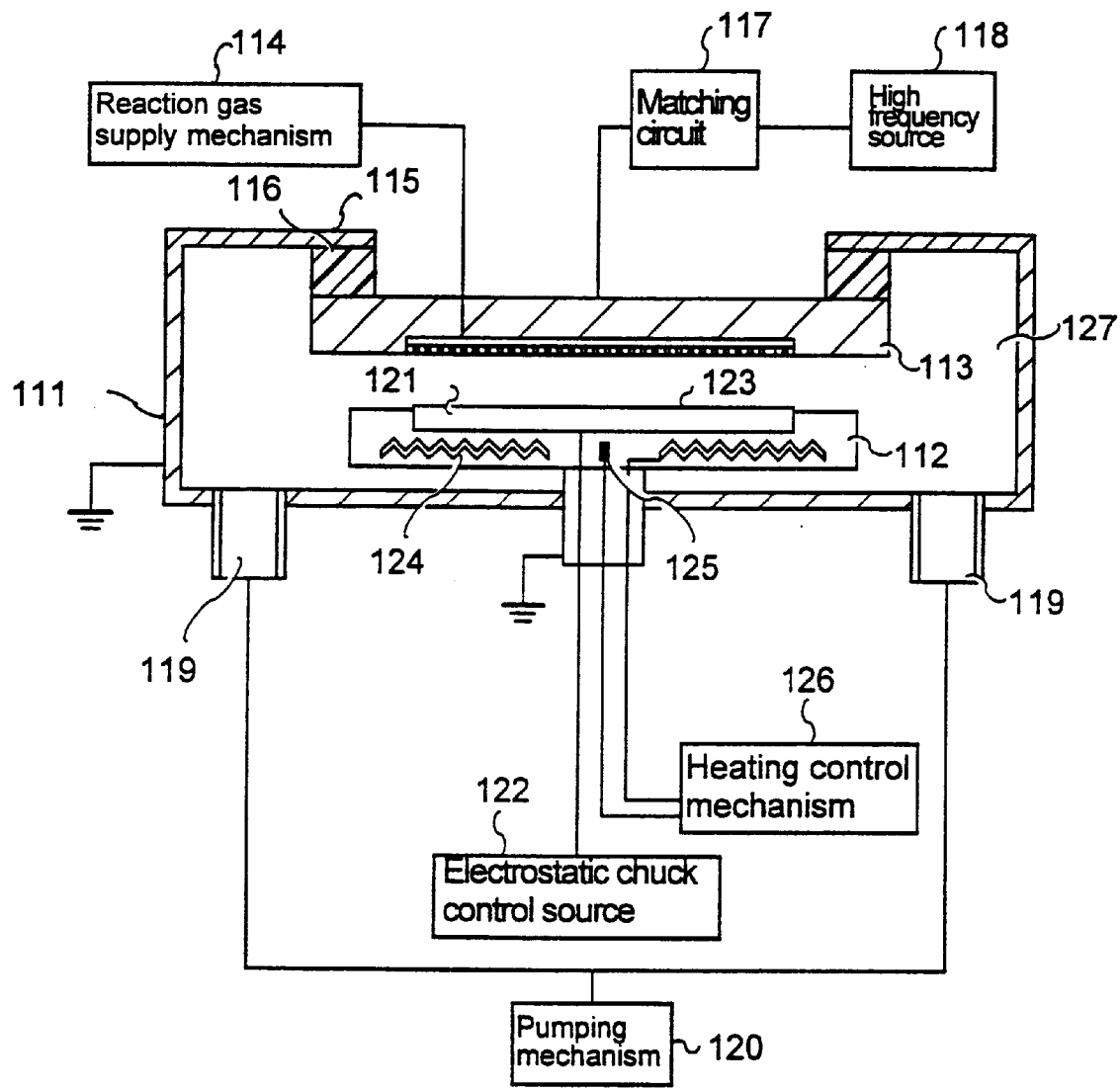
FIG. 4 is a vertical cross-sectional view which shows a conventional PECVD apparatus.
Figure 5:
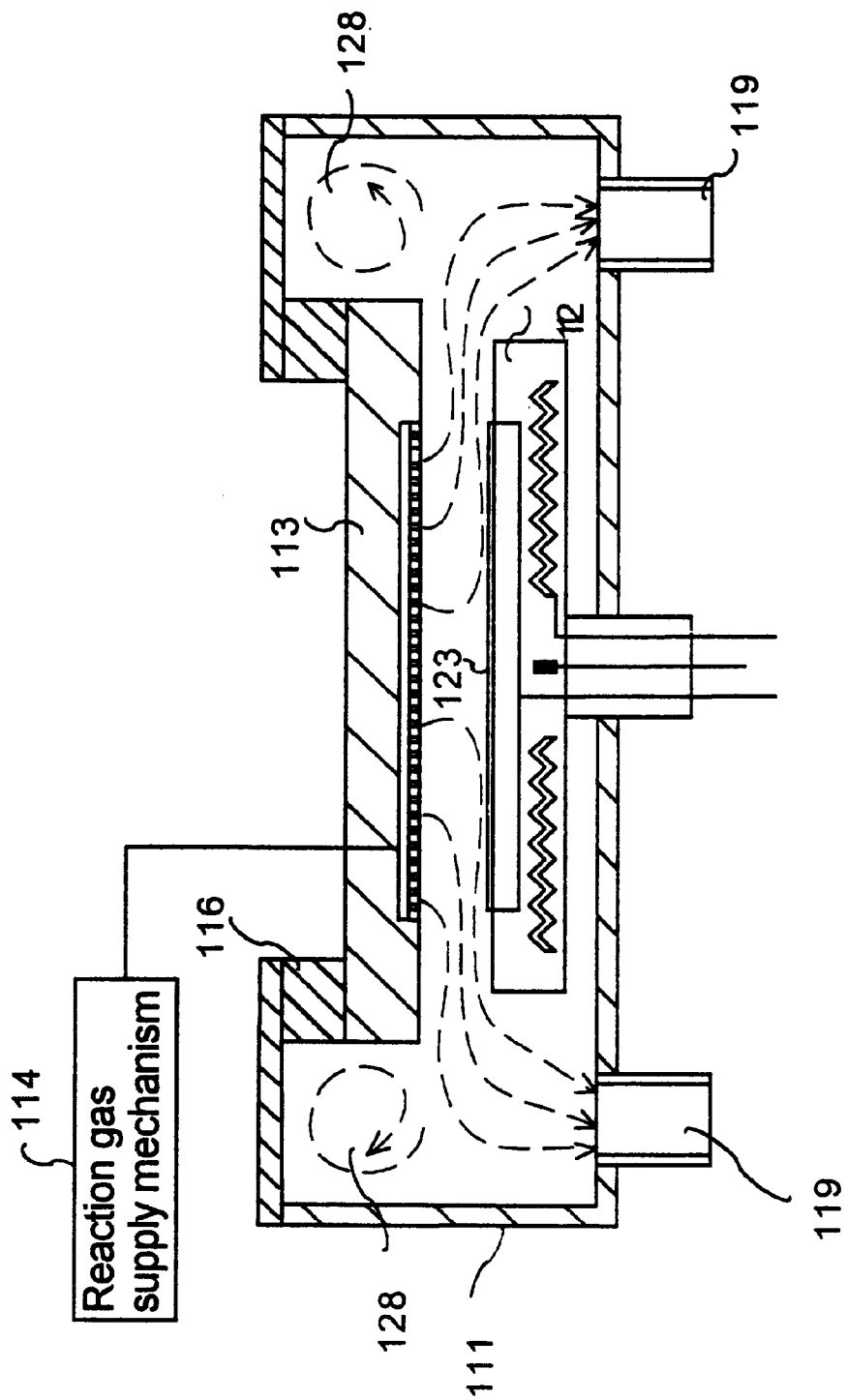
FIG. 5 is a drawing which shows the dead space and the state of retention of reaction gas in the conventional PECVD apparatus of FIG. 4.

The inhibition of the retention or circulation of reaction gas in the space between the reaction gas delivery part 13 and the walls of the reactor 11 in the aforementioned PECVD apparatus is described below. The flow-lines 32 of the flow of reaction gas and the flow-lines 33 of the purge gas in the reactor 11 in this PECVD apparatus are shown in FIG. 3. The flow-lines 32, 33 of the flows of these gases have been drawn-in on the basis of a simulation with numerical calculation. As is clear from FIG. 3, the purge gas is delivered from the upper wall 11a surrounding the reaction gas delivery part 13 and the purge gas flows into the dead space. Moreover, this purge gas flow eliminates the entry of reaction gas into the dead space. Moreover, just a uniform downward flow of purge gas (a uniform down-flow) is produced in the dead space. Hence, there is no reaction or retention in the space between the side wall of the gas delivery part 13 and the side part of the reactor 11. Moreover, the uniform down-flow in the dead space does not disrupt the flow of reaction gas which contributes to the film deposition. The purge gas should be discharged uniformly into the interior of the reactor 11 in order to minimize or prevent any circulation of reaction gas in the dead space. Uniform discharge of the purge gas into the reactor 11 is achieved by the positioning of the holes 27 and the structure of the porous plate 31.

According to the results obtained on investigating the temperature distribution of the $TiCl_4$ on the basis of a simulation with numerical calculation it is clear that the temperature of the $TiCl_4$ in the space between the side surface of the gas delivery part 13 and the side wall of the reactor 11 can be reduced to about one tenth of that in conventional PECVD apparatus.

The amount of film deposited on the inner surface of the walls of the reactor 11 in actual film deposition using this PECVD apparatus is reduced to about one tenth. The generation of dust particles is also reduced with this PECVD apparatus when compared with conventional PECVD apparatus. The length of the maintenance cycle with this PECVD apparatus is also increased by a factor of from 1.5 to 2 times compared with that in the case of conventional PECVD apparatus because the amount of undesired film deposited on the inner surface of the walls of the reactor 11 is reduced.

Moreover, as a secondary effect, with this PECVD apparatus, the deposition rate can be increased about 10% when compared with that of conventional PECVD apparatus. This increase in the deposition rate arises because diffusion within the reactor 11 of the $TiCl_4$ which is the source gas is prevented by the uniform down-flow in the dead space. The utilization efficiency of the source gas is increased by preventing the diffusion of the source gas. Hence, the increase in the utilization efficiency of the source gas results in an increase in the deposition rate.

PECVD apparatus has been described in the embodiment described above, but of course a similar construction can be used for dead spaces which are produced in film deposition apparatus including thermal CVD apparatus.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A chemical vapor deposition apparatus, comprising:
   a reaction chamber for holding a substrate and including a plurality of exhaust ports and the reaction chamber having a dead space therein, the exhaust port being located below the substrate and in an area that is external to an outer diameter of the substrate the dead space partially defined by an upper wall of the reaction chamber and being outside of a flow-way of a reaction gas which reaches the plurality of exhaust ports, the dead space includes an inlet area through which reaction gas may enter, but which does not include an outlet through which the reaction gas can escape;

reaction gas inlet located at a top part of the reaction chamber facing toward the substrate means for delivering a purge gas to all of the dead space, the means for delivering the purge gas arranged adjacent to the upper wall; and means for exhausting the purge gas from the reaction chamber such that a uniform down-flow of purge gas is formed in the dead space from the means for delivering to the plurality of exhaust ports so that reaction gas in the dead space is substantially eliminated.

2. The apparatus of claim 1, wherein the reaction chamber has a center axis and the delivering means includes a plurality of holes substantially equally spaced symmetrically with respect to the center axis in the upper wall.

3. The apparatus of claim 2, further comprising a reservoir formed on an interior surface of the upper wall, and the reservoir is connected to the holes.

4. The apparatus of claim 3, further comprising a porous plate covering the reservoir.

5. The apparatus of claim 2, wherein the exhausting means includes the plurality of exhaust ports located symmetrically with respect to the center axis in a bottom wall of the reaction chamber.

6. The apparatus of claim 1, wherein the means for delivering a purge gas includes a porous plate arranged parallel to the upper wall for defining a reservoir between the upper wall and the porous plate.

7. A chemical vapor deposition apparatus, comprising:

a reaction chamber for holding a substrate and including a plurality of exhaust ports and the reaction chamber having a dead space therein, the exhaust port being located below the substrate and in an area that is external to an outer diameter of the substrate dead space partially defined by an upper wall of the reaction chamber and being outside of a flow-way of a reaction gas which reaches the plurality of exhaust ports, the dead space includes an inlet area through which the reaction gas may enter, but which does not include an outlet through which the reaction gas can escape;

reaction gas inlet located at a top part of the reaction chamber facing toward the substrate means for delivering a purge gas to all of the dead space, the means for delivering including a plurality of holes in the upper wall of the reaction chamber; and means for exhausting the purge gas from the reaction chamber including the plurality of exhaust ports located in a bottom wall of the reactor chamber, wherein the plurality of holes of the means for delivering are positioned directly across from the plurality of exhaust ports such that a uniform down-flow of purge gas is formed in the dead space from the means for delivering to the means for exhausting such that entry of the reaction gas into the dead space is substantially eliminated.

8. The apparatus of claim 7, wherein the means for delivering a purge gas includes a porous plate arranged parallel to the upper wall for defining a reservoir between the upper wall and the porous plate.

* * * * *